United States Patent
Gießibl

(10) Patent No.: US 12,051,541 B2
(45) Date of Patent: Jul. 30, 2024

(54) DEVICE FOR CORRECTING AN EXTERNAL STRESS OVERLOAD AFFECTING A FERROMAGNETIC COMPONENT

(71) Applicant: Methode Electronics Malta Ltd., Birkirkara (MT)

(72) Inventor: Johannes Gießibl, Amerang (DE)

(73) Assignee: Methode Electronics Malta Ltd., Birkirkara (MT)

( * ) Notice: Subject to any disclaimer, the term of this patent is extended or adjusted under 35 U.S.C. 154(b) by 0 days.

(21) Appl. No.: 17/546,705

(22) Filed: Dec. 9, 2021

(65) Prior Publication Data
US 2022/0199308 A1    Jun. 23, 2022

(30) Foreign Application Priority Data

Dec. 21, 2020    (DE) ...................... 10 2020 134 513.5

(51) Int. Cl.
| | |
|---|---|
| H01F 7/06 | (2006.01) |
| G01R 33/02 | (2006.01) |
| H01F 7/20 | (2006.01) |

(52) U.S. Cl.
CPC ............. *H01F 7/064* (2013.01); *G01R 33/02* (2013.01); *H01F 7/20* (2013.01)

(58) Field of Classification Search
CPC .......... H01F 7/064; H01F 7/20; G01R 33/02; G01R 33/04; G01R 33/07; G01R 33/09; G01R 33/0017; G01R 33/0385
USPC ....................................................... 361/143
See application file for complete search history.

(56) References Cited

U.S. PATENT DOCUMENTS

| | | | | |
|---|---|---|---|---|
| 4,811,609 | A * | 3/1989 | Nishibe ................... | G01L 3/105 73/862.333 |
| 6,983,657 | B1 * | 1/2006 | Kakutani ................ | G01L 1/125 73/779 |
| 9,683,906 | B2 | 6/2017 | Gießibl | |
| 9,958,295 | B2 | 5/2018 | Gießibl | |
| 10,151,652 | B2 | 12/2018 | Gießibl | |
| 10,247,578 | B2 | 4/2019 | Bonnici et al. | |
| 10,488,278 | B2 | 11/2019 | Gießibl | |
| 2008/0316669 | A1 * | 12/2008 | May ........................ | H01F 13/00 361/143 |
| 2020/0011747 | A1 | 1/2020 | Mir et al. | |

(Continued)

FOREIGN PATENT DOCUMENTS

| | | | | |
|---|---|---|---|---|
| JP | | 2000009558 A | * 1/2000 | |
| WO | WO-2009136116 A2 | * 11/2009 | ............ | G01R 33/02 |

OTHER PUBLICATIONS

Machine translation of Chanteur et al. International Patent Document WO 2009136116 A2 Nov. 12, 2009 (Year: 2009).*

(Continued)

*Primary Examiner* — Kevin J Comber
(74) *Attorney, Agent, or Firm* — Greenberg Traurig, LLP

(57) ABSTRACT

Device for correcting the effect of an external stress overload affecting a ferromagnetic component, comprising: the ferromagnetic component, having at least one magnetic field, and a magnetic field sensor, and at least one coil, being arranged around the magnetic field sensor and/or around the ferromagnetic component, and generating a magnetic field, with the field providing an oscillating magnetic field and a magnetic flux density of at least 30 Gauss.

19 Claims, 3 Drawing Sheets

(56) References Cited

U.S. PATENT DOCUMENTS

2021/0055174 A1  2/2021  Gießibl
2021/0293906 A1  9/2021  Barraco

OTHER PUBLICATIONS

Machine translation of Ishino Japanese Patent Document JP 2000-9558 A Jun. 29, 1998 (Year: 1998).*

* cited by examiner

DEVICE FOR CORRECTING AN EXTERNAL STRESS OVERLOAD AFFECTING A FERROMAGNETIC COMPONENT

RELATED APPLICATION DATA

This application claims the benefit of German patent application DE 10 2020 134 513.5, filed Dec. 21, 2020, the disclosure of which is incorporated by reference herein.

BACKGROUND

The disclosure refers to a device and an associated method for correcting the effect of an external stress overload affecting a ferromagnetic component U.S. Pat. No. 1,345,362 reveals a device for detecting an excessive mechanical stress in a structure that has a structural element comprising two zones which are subject to a relative displacement when the structure is subjected to a mechanical stress. The device provides an indication system when a predetermined amount of mechanical stress is applied to the structure.

An external stress overload acting on the ferromagnetic component of a magnetic field sensor may lead to a negative effect on an output signal of the sensor.

The external stress overload may be due to a mechanical stress.

Obviously, the external stress overload may also be due to other reasons, not referred to above.

Thus, a device and/or a method should be made available which offset the negative effect caused by the external stress overload on the ferromagnetic component.

SUMMARY OF DISCLOSURE

The problem is solved by means of a device for correcting the effect of an external stress overload acting on a ferromagnetic component. The ferromagnetic component comprises at least one magnetic field. The device also comprises a magnetic field sensor.

At least one coil is arranged around the magnetic field sensor and/or around the ferromagnetic component.

The coil generates an oscillating magnetic field and a magnetic flux density of at least 30 Gauss.

Ferromagnetic Component

Both product-related and also external magnetic fields are in an operative relationship to a magnetized body. In the following, it is assumed that the ferromagnetic component is a magnetized body.

The ferromagnetic component can be an elongate body, for example a cylindrical body, a conically tapering body or a shaft.

The ferromagnetic component is at least partially provided with a ferromagnetic material. Hardenable steel having a nickel (Ni) or chromium (Cr) fraction is suitable as such ferromagnetic material. It is however understood that other ferromagnetic materials can also be used.

The ferromagnetic component can be configured as a drive shaft or as a Pitman arm shaft. Preferably the ferromagnetic component is disposed in an air, land or water vehicle. The ferromagnetic component can also be used in an industrial device or a domestic appliance.

The ferromagnetic component comprises at least one magnetized region, which may have magnetic tracks with oppositely directed magnetizations.

For reasons of simplification, in the following, the magnetized region of the ferromagnetic component is referred to as the magnetic field of the ferromagnetic component.

The magnetic field emitted by the ferromagnetic component is produced by applying a so-called stress in the material to the ferromagnetic component. This can be accomplished, for example, by applying a torque.

The magnetic-field shows a magneto-elastic effect which is obtained in cooperation with the type of magnetization used to generate the magnetic field. The magnetic field can be applied to the ferromagnetic component in different technical ways. The magnetic field can be measured by a magnetic field sensor.

A magnetic field variation can be obtained as a result of both product-related influences and as a result of external influences, so-called interfering influences.

Applying an External Stress to the Ferromagnetic Component, Thus Triggering an Overload of Stress on the Ferromagnetic Component

External Stress

The magnetized ferromagnetic component is subjected to an external stress overload.

In the following, the wording external stress overload is meant as physical stress overload acting on the ferromagnetic component.

The external stress overload can act axially or radially on the ferromagnetic component.

The external stress overload acting on the ferromagnetic component can be caused by bending and/or twisting and/or pulling and/or pushing the ferromagnetic component.

It is assumed that an external stress overload is imposed on the ferromagnetic component by twisting the ferromagnetic component.

For reasons of simplification it is assumed below that the external stress overload which is applied to the ferromagnetic component is a torque.

It goes without saying that the external stress overload acting on the ferromagnetic component can also be caused by any other mechanical influence, acting on the ferromagnetic component. Thus, the ferromagnetic component can be subject to various other physical movements to impose external stress overload on the ferromagnetic component.

Effect of the External Stress Overload on the Ferromagnetic Component

Imposing an external stress overload on the ferromagnetic component damages or destroys the magnetic field and/of the ferromagnetic component.

In other words, an external stress overload acting on the ferromagnetic component leads to the disturbance and/or to the destruction of the magnetic field of the ferromagnetic component.

When the magnetic field of the ferromagnetic component is destroyed by the external stress overload, the ferromagnetic component loses its ability to act as a primary sensor creating an external magnetic field caused by the applied stress.

Imposing the external stress overload on the ferromagnetic component may also lead to a magnetic flux density of at least 30 Gauss acting on the magnetic field of the ferromagnetic component.

The physical unit Gauss represents a unit of measurement of a magnetic flux density of the ferromagnetic component.

The magnetic flux density also describes the magnetic influence of electric charges in relative motion of a ferromagnetic component.

Effect of the External Stress Overload Acting on the Ferromagnetic Component, on the Magnetic Field of the Ferromagnetic Component When the ferromagnetic component is affected by an external stress overload the magnetic field of the ferromagnetic component is either damaged or destroyed.

The effect on the magnetic field of the ferromagnetic component can be shown by a coordinate system of the FIG. 1 representing the voltage values (V) of a current in mV (Millivolt) on the Y-axis of the coordinate system.

The X-axis of the coordinate system shows magnetic flux density values of the magnetic field applied to the ferromagnetic component in Gauss (measurement unit: Gauss) after it was exposed to an external stress overload.

The external stress overload affecting the ferromagnetic component leads to a shift and/or to an offset of the zero point of the X-axis of a coordinate system relative to the Y-axis.

The external stress overload affecting the ferromagnetic component also results in a change of the gradient of the curve. Thus, the external stress overload affecting the ferromagnetic component shows that the gradient of the curve representing the mV-values of the Y-axis in relation to the Gauss-values of the X-axis has changed.

The device corrects the effect of an external stress overload affecting the ferromagnetic component by means of at least one coil.

Coil

The device for correcting the effect of an external stress overload affecting a ferromagnetic component, provides at least one coil.

The coil is wound around the ferromagnetic component and/or is wound around the magnetic field sensor.

The at least one coil preferably includes wire windings. Insofar as there is talk of a coil within the framework of the disclosure, it is preferably a wire winding around the sensor and the primary magnetized part.

According to the disclosure the coil is a wire conducting electricity. Most frequently, the coil is made of copper.

The wire of the coil is shaped in a helical form around an iron core. The iron core being the magnetized ferromagnetic component used to transfer the applied stress. According to the disclosure, the iron core of the coil is provided by the ferromagnetic component.

The coil creates an inductor together with the ferromagnetic component (core).

The coil provides a magnetic flux density of a at least 30 Gauss.

The coil can be activated at regular intervals. The coil is activated globally and/or regularly or once only and/or depending on a specific event. The coil can also be activated manually.

It goes without saying that the coil according to the disclosure can be activated whenever a malfunction of a system occurs.

The oscillating magnetic field of a magnetic flux density of at least 30 Gauss provided by the coil, wound around the magnetic field sensor and/or wound around the ferromagnetic component has the effect that the axially oscillating magnetic field resets a magnetic disturbance of the ferromagnetic component, which is caused by the external stress overload imposed on the ferromagnetic component, back to normal.

Oscillating Magnetic Field

According to the disclosure the coil of the device comprises an oscillating field of a magnetic flux density of at least 30 Gauss.

The coil, equipped with the 30 Gauss field, is wound around the magnetic field sensor and/or is wound around the ferromagnetic component.

The oscillating field of the coil implies that there is an electronic circuit producing a periodic, oscillating electronic signal.

That oscillating electronic signal may have a sine wave or a square ware.

Depending on the number of windings of the coil, the coil neither requires a high amount of electricity nor a high amount of electric voltage to provide a 30 Gauss magnetic field.

The 30 Gauss magnetic field can be provided by the electricity made available by a common vehicle 12 V battery.

At least one coil, providing the oscillating 30 Gauss magnetic field, is wound around the magnetic field sensor and/or is wound around the ferromagnetic component.

The device for correcting the effect of an external stress overload affecting a ferromagnetic component comprises the coil referred to above.

It is the coil, being wound around the sensor and/or being wound around the ferromagnetic component, which corrects the external stress overload induced by a residual magnetic field change of the ferromagnetic component.

The coil which is wound around the sensor and/or wound around the ferromagnetic component returns the impaired sensitivity and offset of the magnetic field sensor back to normal.

The impaired sensitivity and offset is due to the external stress overload affecting the ferromagnetic component.

The oscillating magnetic field of a magnetic flux density of at least 30 Gauss arranged around the magnetic field sensor and/or arranged around the ferromagnetic component restores the relation within the coordinate system between the Y-axis mV-values (representing the voltage) and the Gauss-values (representing the magnetic flux density) of the X-axis back to normal.

A deviation of the zero point of the Gauss-values of the X-axis of the coordinate system is restored as well.

The arrangement of the oscillating magnetic field of a magnetic flux density of at least 30 Gauss of the coil wound around the sensor and/or wound around the ferromagnetic component leads to a homogenization of the magnetic field of the sensor. Thus, returning the disturbed signal value of the device for correcting the effect of an external stress overload affecting a ferromagnetic component, comprising the ferromagnetic component and the magnetic field sensor back to normal.

The coil, correcting and/or compensating the effect of the overload stress on the magnetic field sensor and/or on the ferromagnetic component is also wrapped around the sensor and/or the ferromagnetic component.

In other words, the device for correcting the effect of an external stress overload affecting a ferromagnetic component, providing an oscillating magnetic field of a magnetic flux density of at least 30 Gauss readjusts the magnetic field of the ferromagnetic component being disturbed by the external stress overload having affected the ferromagnetic component.

The shifting of the zero point is due to the external stress overload affecting the magnetic field of the ferromagnetic component. Said shifted zero point is returned to the original zero point by means of the coil. With the coil being arranged around the magnetic field sensor and/or being arranged around the ferromagnetic component.

Also, according to the FIG. 1 the change of the gradient of the curve which is due to the external stress overload affecting the ferromagnetic component, representing the mV-values of the Y-axis in relation to the Gauss-values of the X-axis before the external stress overload affected a ferromagnetic component the curve resumes its original course.

The original course and/or the original gradient of the curve represents the course and/or the gradient of the curve before the ferromagnetic component was affected by the external stress overload.

Any effect which is due to the external stress overload affecting the ferromagnetic component and having led to a change and/or to a destruction and/or to a disturbance of the magnetic field of the ferromagnetic component is cancelled due to the arrangement of the field of the coil around the sensor and/or around the ferromagnetic component.

Magnetic Field Sensor

Magnetic field sensors are used for measuring magnetic fields. In the following the Magnetic field sensors are referred to as sensors.

Magnetic field sensors convert the magnetic flux or the magnetic field strength into an electrical quantity. Magnetic field sensors are contactless, reliable and wear-free sensors, which can be produced at fairly low cost.

They are frequently used for the detection of other physical quantities such as pressure, fill level, rotational speed, current, rotational movement, torque, directional changes, or else.

Magnetic field sensors include, inter alia, Hall sensors and magneto-resistive sensors.

So-called fluxgate sensors may also be called saturation core probes or Foerster probes. They are high-sensitivity magnetic field sensors.

The magnetoelastic technology uses basic mechanical and magnetic properties of the material to measure various parameters. Measurements are made of changes in the properties of magnetic fields which accompany a change in the mechanical properties, for example, the shear stressing under the action of external forces on a magnetized component.

The technology is applied by directly magnetizing mechanical elements instead of attaching additional elements to the component such as a magnetized ring or a strain gauge.

Highly sensitive magnetic field coil based sensors which are located in the immediate vicinity of the magnetized element identify a change in the magnetic field properties which are proportional to the applied force. These changes are linear and reproducible within the elastic limits of the material. They are precise under normal application conditions.

The magnetic field sensor is used for the detection of forces which act on a metal magnetized body. Such forces may, for example, occur due to the application of torque to a shaft which is magnetized.

This is because such a force has effects on the stress in the component, which changes the magnetic field position of the respective body and which may be detected by means of magnetic field sensors.

If at least one magnetic field sensor is arranged radially spaced apart in relation to a magnetized component, for example a steering shaft and a force such as a torque is applied to that component.

The magnetic field sensor is a highly sensitive measuring device for detecting extremely small magnetic fields.

The magnetic field sensors preferably work on a magnetic field sensing coil basis. The magnetic field sensing coil sensor is a highly sensitive measuring device for detecting extremely small magnetic fields.

Hall sensors, for example, can also be used as magnetic field sensors in the sense of the present disclosure.

It should be noted however that any suitable type of magnetic field sensors can be used according to the disclosure.

Sensitivity of the Magnetic Field Sensor

A sensitivity of the magnetic field sensor is defined as a slope of the output characteristic curve.

In other words, the sensitivity of the sensor can be described as the minimum input of a physical parameter which will create an output change of the sensor which can be detected.

Method

The disclosure provides a method for correcting the effect of an external stress overload affecting a ferromagnetic component, having at least one magnetic field and at least one magnetic field sensor.

Also there is at least one coil being arranged around the magnetic field sensor and/or around the ferromagnetic component. The coil generates an oscillating magnetic field, having a magnetic flux density of at least 30 Gauss.

Examples of Use

The device for correcting the effect of an external stress overload affecting a ferromagnetic component may be activated, every time a predefined system of the vehicle has been started.

Whenever there is a risk that a ferromagnetic component is exposed to an external stress overload, the device for correcting an external stress overload affecting the ferromagnetic component, comprising a 30 Gauss magnetic field can be used. Thus, the external stress overload of the ferromagnetic component is set back to normal.

Whenever an external stress overload affects the ferromagnetic component, the signal representing the magnetic field of the ferromagnetic component, exceeds the working range of the magnetic field sensor.

The disclosure can be used for power steering systems of a vehicle. The vehicle is parked with its front wheels alongside the kerb, in that the front wheels cannot be turned in. An external stress overload acts on a shaft of the steering system when the driver attempts to turn the steering wheel to move the front wheels.

The device for correcting an external stress overload affecting the ferromagnetic component can also be used, when a steering wheel lock of the vehicle is activated. A mechanic, trying to remove a front wheel of the vehicle applies great force to remove the tyres of the hub off the wheel suspension.

DETAILED DESCRIPTION

Figure 1:
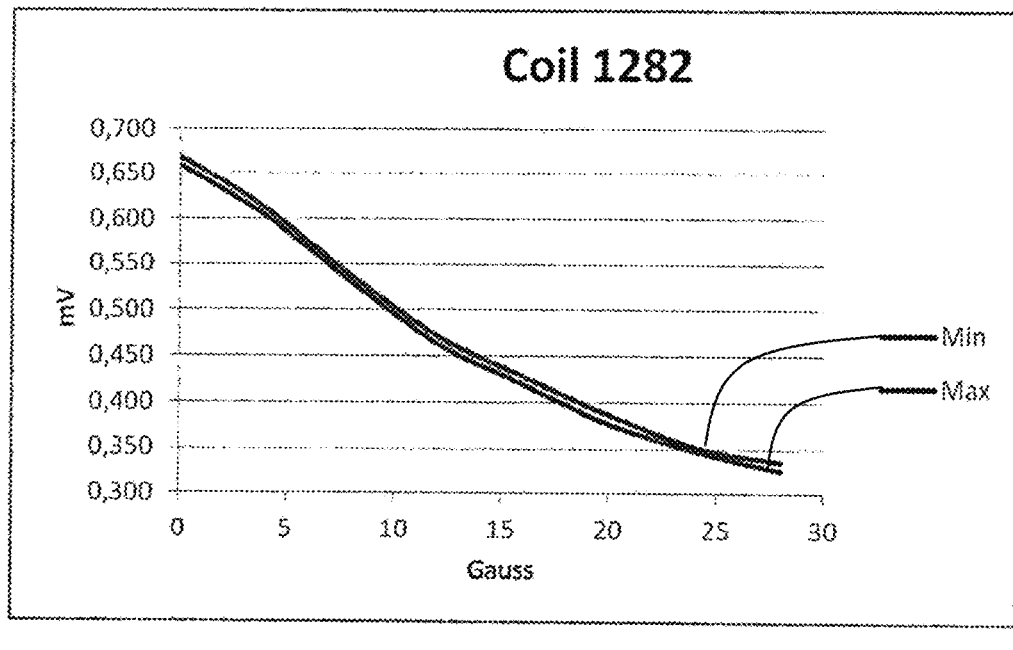
FIG. 1 is a graph showing the effect on a magnetic field of a ferromagnetic component in terms of Gauss levels on the X-Axis and the voltage values (V) of a current in mV (Millivolt) on the Y-axis and including a table of the values shown in the graph.
Figure 2:
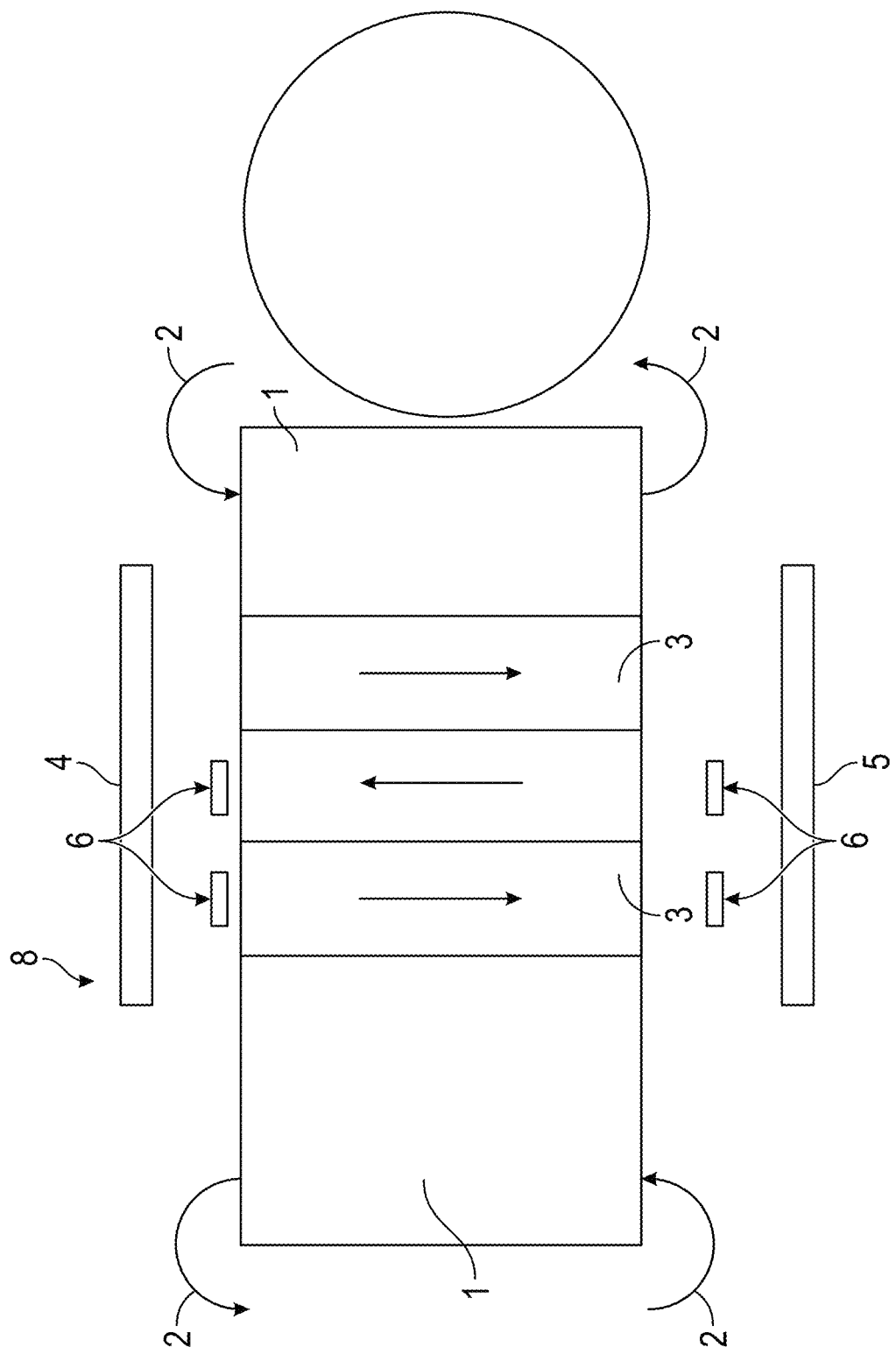
FIG. 2 shows a device for correcting the effect of an external stress overload affecting a ferromagnetic component.

In the FIG. 2 a device 8 is shown for correcting the effect of an external stress overload 2 affecting a ferromagnetic component 1.

The ferromagnetic component 1 has at least one magnetic field 3.

Figure 3:
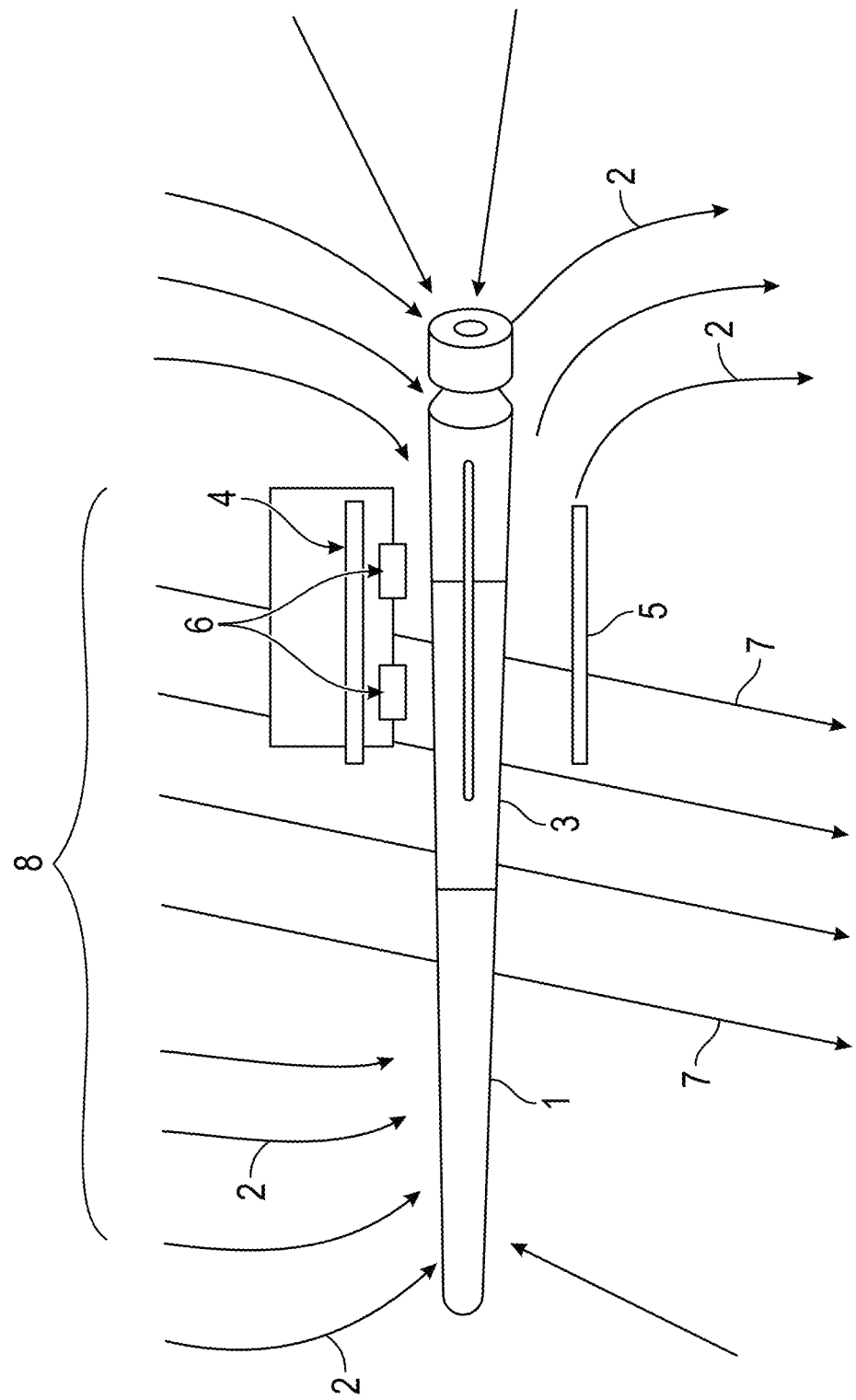
FIG. 3 shows the device for correcting the effect of an external stress overload affecting a ferromagnetic component under the influence of an external magnetic field.

In the sectional views of the FIGS. 2 and 3 one coil each is displayed, showing a top cross section 4 of the coil and a lower cross section 5 of the coil. Both cross sections 4, 5 form the coil. Thus, in the following the coil is referred to as coil 4, 5.

The coil 4, 5 provided in the FIGS. 2 and 3 are arranged around both the magnetic field sensor 6 and around the ferromagnetic component 1.

The coil 4,5 generate a magnetic field (not shown). The field of the coil 4,5 shown in the FIGS. 2 and 3 respectively, provide an oscillating magnetic field and a magnetic flux density of at least 30 Gauss.

In the FIG. 3, the ferromagnetic component 1 of the device 8 is displayed in form of a magnetic antenna having at least one magnetic field 3.

The ferromagnetic component 1 and/or the magnetic field 3 of the ferromagnetic component 1 is set under the influence of an external magnetic field 7 resulting in an external magnetic field influence 2 affecting said ferromagnetic component 1 and/or the magnetic field 3 of the ferromagnetic component 1.

REFERENCES

1 Ferromagnetic component
2 External stress overload
3 Magnetized region
4 Coil top cross section
5 Coil lower cross section
6 Magnetic field sensor
7 External magnetic field
8 Device

What is claimed is:

1. A device configured to correct an effect of an external stress overload affecting a ferromagnetic component, the device comprising:
    the ferromagnetic component having at least one magnetized region;
    at least two magnetic field sensors; and
    at least one coil being arranged around the at least two magnetic field sensors and the ferromagnetic component, the at least one coil configured to generate a magnetic field comprising an oscillating magnetic field and a magnetic flux density of at least 30 Gauss.

2. The device according to claim 1, wherein each of the at least two magnetic field sensors has a variable sensitivity.

3. The device according to claim 1, wherein the at least one coil is activated at at least one of regular intervals, while there is a malfunction in a system encompassing the ferromagnetic component, or while the system encompassing the ferromagnetic component is restarted.

4. The device according to claim 1, wherein the at least one coil has a varying number of windings.

5. The device according to claim 1, wherein at least one of the at least two magnetic field sensors comprises a Hall sensor.

6. The device according to claim 1, wherein at least one of the at least two magnetic field sensors comprises a magneto-resistive sensor.

7. The device according to claim 1, wherein at least one of the at least two magnetic field sensors comprises a fluxgate sensor, a saturation core probe, or a Foerster probe.

8. The device according to claim 1, wherein at least one of the at least two magnetic field sensors comprises a magnetic field sensing coil sensor.

9. A method for correcting an effect of an external stress overload affecting a ferromagnetic component wherein the ferromagnetic component has at least one magnetic field, the method comprising:
    providing at least two magnetic field sensors wherein at least one coil is arranged around the at least two magnetic field sensors and around the ferromagnetic component; and
    generating an oscillating magnetic field having a magnetic flux density of at least 30 Gauss.

10. The method according to claim 9, wherein each of the at least two magnetic field sensors have a variable sensitivity.

11. The method according to claim 9, wherein the at least one coil is activated at at least one of regular intervals, while there is a malfunction in a system encompassing the ferromagnetic component, or while the system encompassing the ferromagnetic component is restarted.

12. The method according to claim 9, wherein the at least one coil has a varying number of windings.

13. The method according to claim 9, wherein the oscillating magnetic field is generated by the at least one coil.

14. The method according to claim 9, wherein at least one of the at least two magnetic field sensors comprises a Hall sensor, a magneto-resistive sensor, a fluxgate sensor, a saturation core probe, a Foerster probe, or a magnetic field sensing coil sensor.

15. A device configured to correct an effect of an external stress overload affecting a ferromagnetic component, the device comprising:
    the ferromagnetic component having at least two magnetized regions;
    at least one magnetic field sensor; and
    at least one coil being arranged around the at least two magnetized regions of the ferromagnetic component, the at least one coil configured to generate a magnetic field comprising an oscillating magnetic field, wherein the at least one coil is wound around the at least one magnetic field sensor.

16. The device according to claim 15, wherein the magnetic field generated by the at least one coil has a magnetic flux density of at least 30 Gauss.

17. The device according to claim 15, wherein the at least one coil is activated at at least one of regular intervals, while there is a malfunction in a system encompassing the ferromagnetic component, or while the system encompassing the ferromagnetic component is restarted.

18. The device according to claim 15, wherein:
the at least one magnetic field sensor comprises a first magnetic field sensor and a second magnetic field sensor;
the at least two magnetized regions of the ferromagnetic component comprises a first magnetized region and a second magnetized region;
the first magnetic field sensor is located proximate to the first magnetized region; and
the second magnetic field sensor is located proximate to the second magnetized region.

19. The device according to claim 18, wherein the at least one coil is arranged around the first magnetic field sensor and the second magnetic field sensor.

\* \* \* \* \*